US009350191B2

(12) United States Patent  
Nomoto

(10) Patent No.: US 9,350,191 B2  
(45) Date of Patent: May 24, 2016

(54) SECONDARY-BATTERY CHARGEABLE-LIMIT DETECTING METHOD AND DEVICE OF THE SAME

(75) Inventor: Sinichi Nomoto, Tokyo (JP)

(73) Assignees: FURUKAWA ELECTRIC CO., LTD., Tokyo (JP); FURUKAWA AUTOMOTIVE SYSTEMS INC., Inukami-gun (JP)

( * ) Notice: Subject to any disclaimer, the term of this patent is extended or adjusted under 35 U.S.C. 154(b) by 774 days.

(21) Appl. No.: 13/561,153

(22) Filed: Jul. 30, 2012

(65) Prior Publication Data  
US 2013/0021004 A1 Jan. 24, 2013

Related U.S. Application Data

(63) Continuation of application No. PCT/JP2011/051897, filed on Jan. 31, 2011.

(30) Foreign Application Priority Data

Feb. 5, 2010 (JP) ................... 2010-023733

(51) Int. Cl.  
*G01R 31/36* (2006.01)  
*H02J 7/00* (2006.01)  
*H02J 7/04* (2006.01)  
*B60L 11/18* (2006.01)

(52) U.S. Cl.  
CPC ........... *H02J 7/0091* (2013.01); *G01R 31/3606* (2013.01); *G01R 31/3648* (2013.01); *G01R 31/3679* (2013.01); *H02J 7/0077* (2013.01); *B60L 11/1862* (2013.01)

(58) Field of Classification Search  
CPC .................................................. G01R 31/3679  
USPC .................................................. 320/134, 133  
See application file for complete search history.

(56) References Cited

U.S. PATENT DOCUMENTS 5,864,220 A 1/1999 Reipur et al.  
6,453,249 B1 * 9/2002 Shibutani et al. ............... 702/63

(Continued)

FOREIGN PATENT DOCUMENTS

CN 1402375 A 3/2003  
CN 101031810 A 9/2007

(Continued)

OTHER PUBLICATIONS

International Search Report mailed on May 10, 2011, issued to International Application No. PCT/JP2011/051897, filed on Jan. 31, 2011 (English).

(Continued)

*Primary Examiner* — Samuel Berhanu  
*Assistant Examiner* — Tarikh Rankine  
(74) *Attorney, Agent, or Firm* — Oblon, McClelland, Maier & Neustadt, L.L.P.

(57) ABSTRACT

A secondary-battery chargeable-limit detecting method that detects a charge rate of a chargeable limit and a device of the same are provided. In the chargeable-limit detecting method of the present embodiment, if it is determined that: a temperature measurement value Tm is higher than a temperature threshold Tt in step S3, a voltage measurement value Vm is higher than a voltage threshold Vt in step S4, a voltage excess rate RV is larger than a voltage excess rate threshold Rt in step S11, and an average current Ia is within a predetermined current threshold range in step S12; condition satisfied duration tc in which the conditions of the chargeable limit are satisfied is calculated in step S13. Then, if it is determined that the condition satisfied duration tc is longer than predetermined duration threshold tt in step S15, SOC of the chargeable limit is set in step S16.

10 Claims, 7 Drawing Sheets

(56) References Cited

U.S. PATENT DOCUMENTS

| | | | |
|---|---|---|---|
| 7,200,499 B2 | 4/2007 | Aridome | |
| 8,589,096 B2 | 11/2013 | Kim et al. | |
| 2002/0169808 A1* | 11/2002 | Fromm | 708/204 |
| 2002/0195999 A1* | 12/2002 | Kimura et al. | 320/134 |
| 2006/0276980 A1* | 12/2006 | Mizuno et al. | 702/63 |
| 2006/0276981 A1 | 12/2006 | Aridome | |
| 2008/0150491 A1 | 6/2008 | Bergveld et al. | |
| 2009/0254290 A1 | 10/2009 | Kim et al. | |
| 2009/0256524 A1* | 10/2009 | Nukui | 320/132 |
| 2010/0235072 A1* | 9/2010 | Okazaki | 701/106 |

FOREIGN PATENT DOCUMENTS

| | | |
|---|---|---|
| CN | 100498365 C | 6/2009 |
| CN | 101551444 A | 10/2009 |
| CN | 101634687 A | 1/2010 |
| JP | 2004-226393 A | 8/2004 |
| JP | 2005-106615 A | 4/2005 |
| JP | 2007-285739 A | 11/2007 |
| WO | WO 94/07292 A1 | 3/1994 |

OTHER PUBLICATIONS

Combined Office Action and Search Report issued Feb. 8, 2014 in Chinese Patent Application No. 201180006907.3 (with English language translation and English Translation of Category of Cited Documents).

Extended European Search Report mailed Mar. 4, 2016 in European Patent Application No. 11 739 702.6.

* cited by examiner

SECONDARY-BATTERY CHARGEABLE-LIMIT DETECTING METHOD AND DEVICE OF THE SAME

TECHNICAL FIELD

The present invention relates to a secondary-battery chargeable-limit detecting method of detecting the charge rate of a chargeable limit, which is an upper limit of the chargeable charge rate of a secondary battery, and to a device of the same.

BACKGROUND ART

Recently, the needs for secondary batteries (batteries) have been increasing more and more. For example, in the field of automobiles, since many electric devices which are operated by receiving power from a secondary battery are mounted, the needs for car-mounted secondary batteries are high. As a requirement for secondary batteries, for example, it is required to always maintain a secondary battery in a usable state. In order to satisfy such a requirement, for example, a device or the like which monitors the state of the secondary battery has been conventionally developed.

As an example of the state monitoring of a secondary battery, Patent Document 1 discloses a method of estimating the opened-circuit voltage and remaining capacity of the secondary battery by approximating transient changes of the secondary battery separately by three different time constants. Like this one, many techniques for detecting the charge rate (SOC: State of Charge) and degree of deterioration (SOH: State of Health) of the secondary battery have been conventionally known. Furthermore, in order to maintain SOC of the secondary battery, for example, for a car-mounted secondary battery, a technique of controlling charging by an alternator is known.

A secondary battery has an upper limit on chargeable electric capacity, and SOC of this upper limit is called SOC of a chargeable limit. Even if charging is further continued for the secondary battery that has SOC of the chargeable limit, charge is not carried out almost at all, and energy is wastefully consumed. Also, in an automobile, load on an engine is unnecessarily increased, and fuel consumption is worsened.

Therefore, in order to avoid such unnecessary charge and improve fuel consumption, charge control has been conventionally carried out for secondary batteries. Generally, in conventional charge control, charge of a secondary battery is controlled so that SOC has a predetermined value or be within a predetermined range. The value or the range of SOC serving as a condition for carrying out the charge control is fixed to a constant value or a constant range set in advance.

A conventional method of charge control will be explained by using FIG. 3. In order to explain the conventional charge control method, FIG. 3 shows an example of transition of SOC when charge control is carried out. In the control of the charge rate of a battery, a charge current is controlled (partial charge-rate control) so that SOC is maintained in a predetermined charge control range (range between an upper limit SOC1 and a lower limit SOC2 shown in FIG. 3). When such charge control is carried out, unnecessary power generation such as charging at the upper limit SOC1 or higher can be eliminated, load on an engine can be reduced to improve fuel consumption. Moreover, since the charge is carried out so that SOC of the battery does not become equal to or lower than the lower limit SOC2, the charge state of the battery can be maintained in an appropriate state.

PRIOR ART DOCUMENT

Patent Document

Patent Document 1: Japanese Patent Application Laid-open No. 2005-106615

SUMMARY OF THE INVENTION

Problem to be Solved by the Invention

However, since secondary batteries are varied depending on products or have different deterioration states, SOC of the chargeable limit is different depending on the products or is different depending on the deterioration state. Since the capacity of the secondary battery is reduced as deterioration progresses, SOC of the chargeable limit is also reduced. Therefore, if the value or the range of SOC serving as the condition for carrying out the charge control is fixed, the range of SOC by which the charge control can be carried out is also narrowed as SOC of the chargeable limit is reduced. If deterioration of the secondary battery further progresses, the charge control may not be able to be carried out. Therefore, it is preferred to detect SOC of the chargeable limit and adjust the condition for carrying out the charge control; however, the method of detecting SOC of the chargeable limit has not been conventionally known.

As shown in FIG. 3, in the conventional battery charge control, the upper limit SOC1 and the lower limit SOC2 of the charge control range are fixed to constant values. On the other hand, SOC of the chargeable upper limit of the battery, in other words, SOC of chargeable limit is reduced as deterioration of the battery as shown in FIG. 4A as an example. FIGS. 4A-4C show explanatory drawings showing examples of over-time change of SOC of the chargeable limit of the battery. Herein, reference numerals 51 and 52 show SOC of the chargeable limit and the chargeable charge control range, respectively.

Reduction of SOC of the chargeable limit is caused when sulfation (crystals of lead sulfate) is generated at an electrode plate of the battery and is hardened during long period of usage to be indecomposable. When the indecomposable sulfation is increased on the electrode plate, the charge/discharge area of the electrode plate is reduced, which leads to reduction of SOC of the chargeable limit.

When SOC of the chargeable limit is reduced as shown in FIG. 4A, the battery cannot be charged to the upper limit SOC1 of the charge control range set in advance, and SOC51 of the chargeable limit lower than that becomes a chargeable upper limit. As a result, the charge control range 52 becomes equal to or higher than the lower limit SOC2 and equal to or less than SOC51 of the chargeable limit, wherein the controllable range is narrowed.

When deterioration of the battery further progresses, as shown in FIG. 4B as an example, SOC51 of the chargeable limit becomes smaller than the lower limit SOC2 of the charge control range. In such a state, the charge control range cannot be ensured, and the battery is always subjected to charge. As a result, the fuel consumption of the engine cannot be improved. In order to ensure the charge control range so that the charge control can be carried out even when deterioration of the battery progresses, SOC51 of the chargeable limit which is reduced along with the deterioration has to be detected, and the charge control range has to be appropriately adjusted based on that as shown in FIG. 4C as an example.

The present invention has been accomplished in order to solve these problems, and it is an object of the present invention to provide a secondary-battery chargeable-limit detecting method that detects the charge rate of the chargeable limit to which the secondary battery can be charged and to provide a device of the same.

Means for Solving the Problems

A first aspect of a secondary-battery chargeable-limit detecting method of the present invention is a secondary-battery chargeable-limit detecting method of detecting a charge rate of a chargeable limit serving as an upper limit of a chargeable charge rate of a secondary battery at every cycle operation time-point of a predetermined cycle; wherein, if reaching the cycle operation time-point, a voltage, a current, and a temperature of the secondary battery are measured; the charge rate of the secondary battery is calculated based on the current measurement value; an average current corresponding to an average value of the current measurement value in a predetermined period is calculated; a voltage excess rate representing a rate that the voltage measurement value becomes higher than a predetermined voltage threshold in a predetermined period is calculated; if conditions that: the temperature measurement value is higher than a predetermined temperature threshold, the voltage measurement value is higher than the voltage threshold, the average current is within a predetermined current threshold range, and the voltage excess rate is larger than a predetermined voltage-excess-rate threshold are determined to be satisfied, condition satisfied duration in which the conditions are continuously satisfied is calculated; and, if the condition satisfied duration is determined to be longer than a predetermined duration threshold, the charge rate is set as the charge rate of the chargeable limit.

In another aspect of the secondary-battery chargeable-limit detecting method of the present invention, if a predetermined weight coefficient is W ($0<W<1$), the average current Ia is calculated from the average current Ia' calculated at a previous cycle operation time-point and the current measurement value Im by a below equation $Ia=Ia'\times(1-W)+Im\times W$.

In another aspect of the secondary-battery chargeable-limit detecting method of the present invention, a voltage-excess determination value that is 1-bit data and m (natural number of 2 or more) units of n-bit data composed of n (natural number of 2 or more) bits are used to set the value of the voltage-excess determination value to 1 if the voltage measurement value is higher than the voltage threshold and to 0 if not; the first n-bit data is shifted to the right by 1 bit to set the value of the voltage-excess determination value at a head bit at a left end; if the value of the voltage-excess determination value is set at all the bits of the first n-bit data, the second n-bit data is shifted to the right by 1 bit, 1 is set at a head bit of the second n-bit data if the number of the bits having the value of 1 in the first n-bit data is equal to or more than a predetermined number, 0 is set if not, and the values of all the bits of the first n-bit data are cleared to 0; and if values are set thereafter at all the bits of the m-th n-bit data in a similar manner, the rate of the number of the bits having a value of 1 in the m-th n-bit data is set to the voltage excess rate.

In another aspect of the secondary-battery chargeable-limit detecting method of the present invention, if the charge rate is determined to be larger than the charge rate of the chargeable limit set therebefore, the charge rate is set as the charge rate of the chargeable limit.

A first aspect of the secondary-battery chargeable-limit detecting device of the present invention is a secondary-battery chargeable-limit detecting device of detecting a charge rate of a chargeable limit serving as an upper limit of a chargeable charge rate of a secondary battery at every cycle operation time-point of a predetermined cycle; the device comprising: a state detecting sensor unit having a voltage sensor that measures a voltage of the secondary battery, a current sensor that measures a current, and a temperature sensor that measures a temperature; a storage unit; and an arithmetic processing unit having a charge-rate calculating means that calculates a charge rate at the cycle operation time-point from a current measurement value measured by the current sensor and a previous charge rate calculated at a previous cycle operation time-point saved in the storage unit, and a chargeable-limit calculating means that determines a predetermined chargeable-limit condition and, if the condition is satisfied, outputs the charge rate of the chargeable limit.

In another aspect of the secondary-battery chargeable-limit detecting device of the present invention, the chargeable-limit calculating means: calculates a voltage excess rate representing a rate that the voltage measurement value is higher than a predetermined voltage threshold in a predetermined period; if conditions that: the temperature measurement value is higher than a predetermined temperature threshold, the voltage measurement value is higher than the voltage threshold, the average current is within a predetermined current threshold range, and the voltage excess rate is larger than a predetermined voltage-excess-rate threshold are determined to be satisfied as the chargeable limit conditions, calculates condition satisfied duration in which the conditions are continuously satisfied; and, if the condition satisfied duration is determined to be longer than a predetermined duration threshold, sets the charge rate as the charge rate of the chargeable limit.

In another aspect of the secondary-battery chargeable-limit detecting device of the present invention, the arithmetic processing unit further has a charge-control-range calculating means that calculates a charge control range with respect to the secondary battery based on the charge rate of the chargeable limit calculated by the chargeable-limit calculating means.

Effects of the Invention

According to the present invention, the secondary-battery chargeable-limit detecting method that detects the charge rate of the chargeable limit to which the secondary battery can be charged and the device of the same can be provided.

DESCRIPTION OF EMBODIMENTS

A secondary-battery chargeable-limit detecting method and a device of the same in a preferred embodiment of the present invention will be explained in detail with reference to drawings. Note that constituent parts having the same functions are denoted by the same symbols for simplifying illustration and explanation. The embodiment of the present invention will be explained below by taking a secondary battery (battery) mounted in an automobile as an example. However, the invention is not limited to that, but may employ any secondary battery for which charge control is carried out.

The present invention provides the secondary-battery chargeable-limit detecting method that detects SOC of the chargeable limit of a battery and provides the device of the same. It is another object of the present invention to provide the secondary-battery chargeable-limit detecting method that sets a suitable charge control range by using SOC of the detected chargeable limit and to provide the device of the same.

Figure 1:
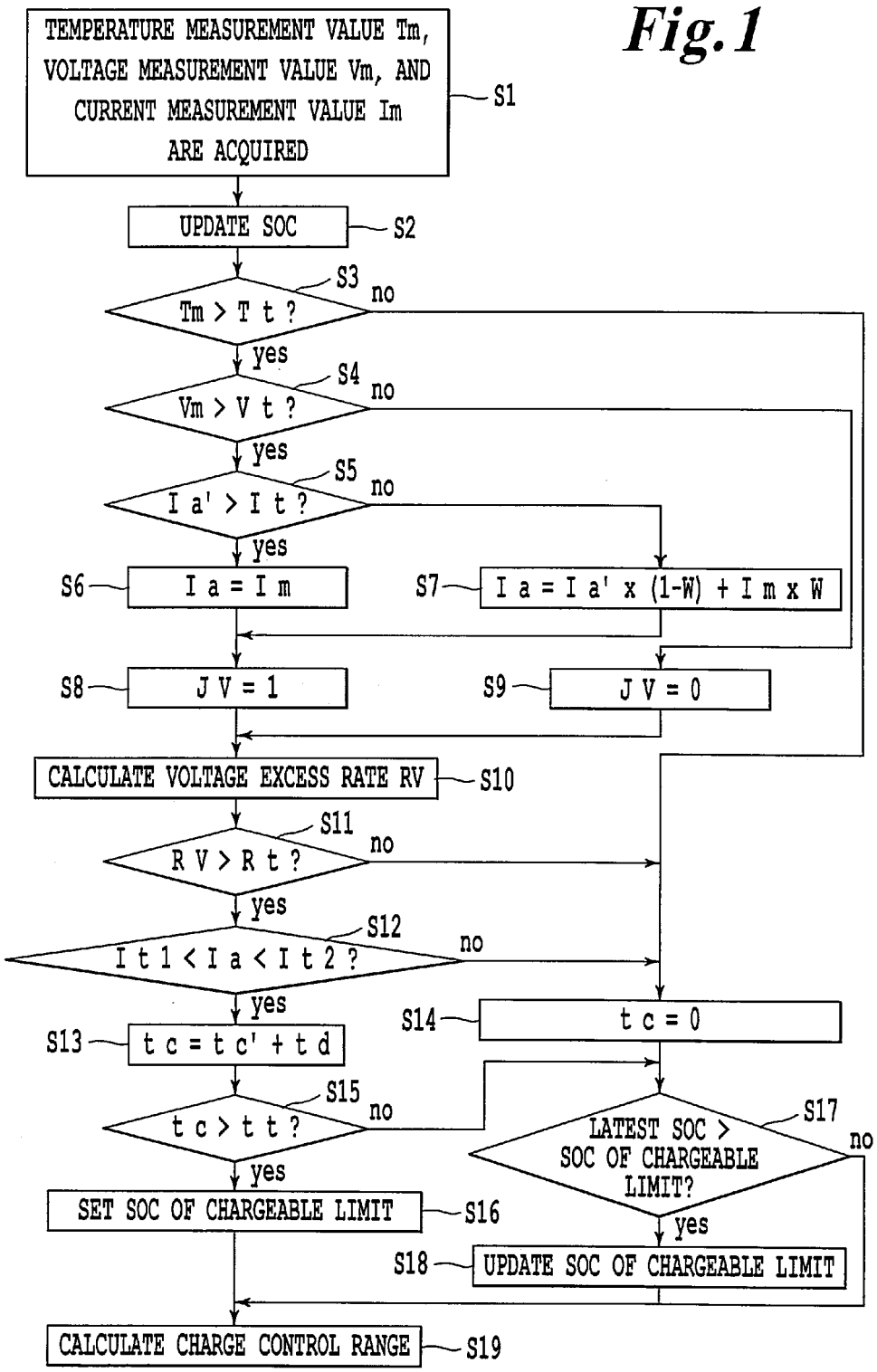
FIG. 1 is a flow chart for explaining a secondary-battery chargeable-limit detecting method according to a first embodiment of the present invention.

The secondary-battery chargeable-limit detecting method according to a first embodiment of the present invention and the device of the same will be explained below by using FIG. 1 and FIG. 2. FIG. 1 is a flow chart for explaining the chargeable-limit detecting method of the first embodiment, and FIG. 2 is a block diagram showing a configuration of the chargeable-limit detecting device of the first embodiment.

Figure 2:
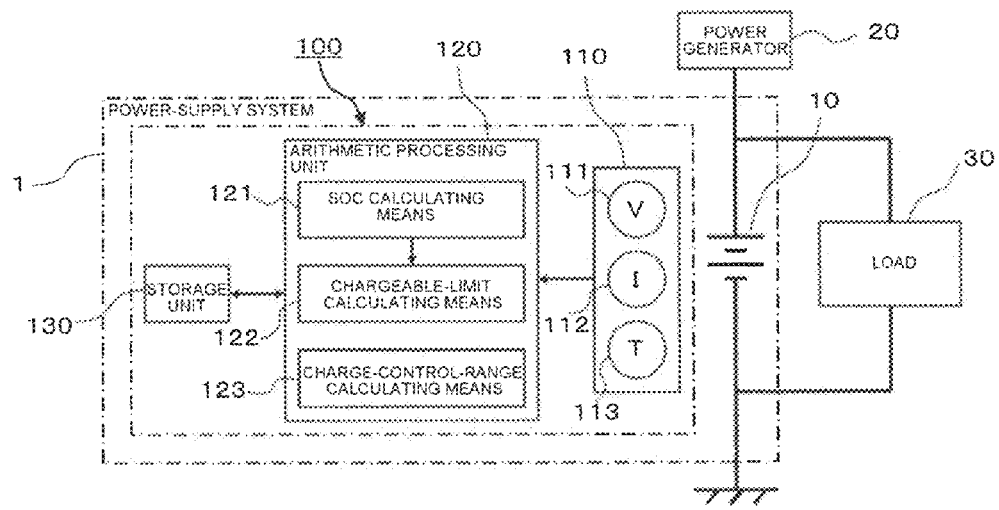
FIG. 2 is a block diagram showing a configuration of a chargeable limit detecting device of the first embodiment.
Figure 3:
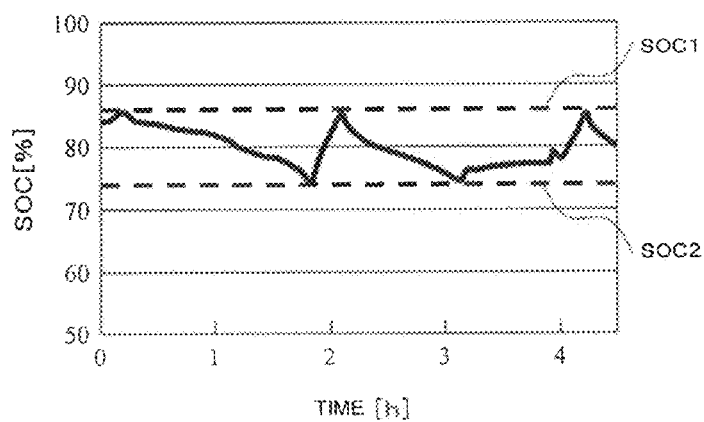
FIG. 3 is an explanatory drawing for explaining a conventional charge control method.
Figure 4A:
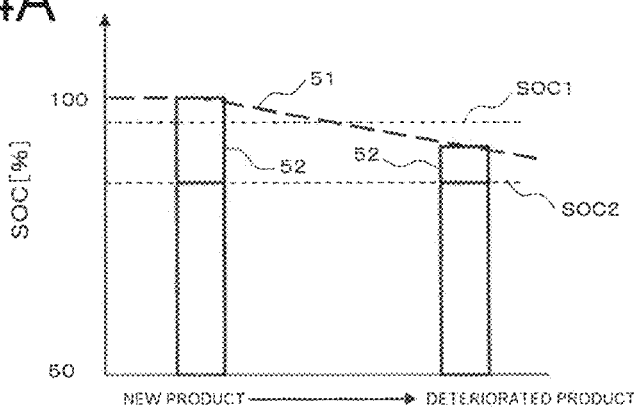
FIGS. 4A, 4B and 4C show an explanatory drawing for explaining a chargeable limit of a secondary battery.
Figure 4B:
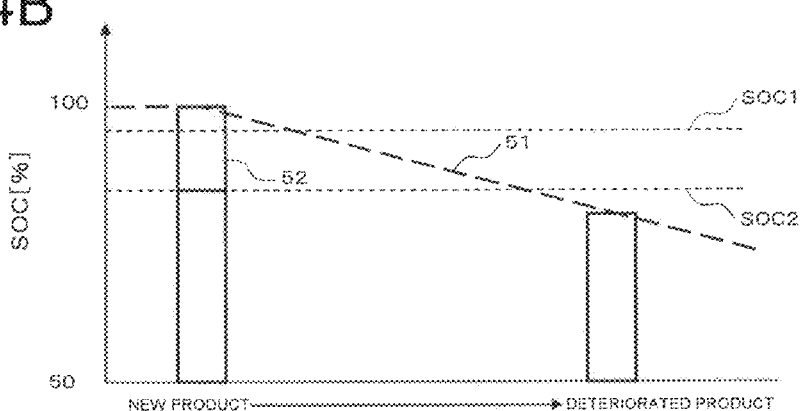
Figure 4C:
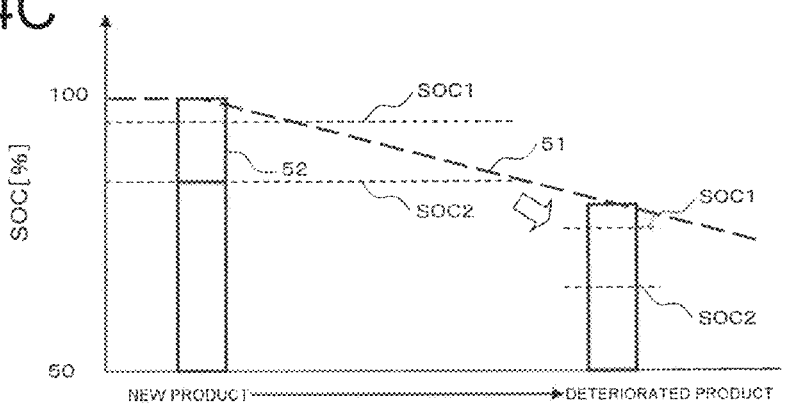

As shown in FIG. 2, the chargeable-limit detecting device 100 of the present embodiment is provided with: a state detecting sensor unit 110, an arithmetic processing unit 120, and a storage unit 130. The state detecting sensor unit 110 is provided with a voltage sensor 111, which measures the voltage of a battery 10; a current sensor 112, which measures the current of the battery 10; and a temperature sensor 113, which measures the temperature of the battery 10. The chargeable-limit detecting device 100 is provided, for example, in a battery power-supply system 1 provided with the battery 10. The battery 10 is connected to a power generator (alternator) 20 and a load 30 and is configured to be charged by the power generator 20 while supplying a necessary current to the load 30.

The arithmetic processing unit 120 has: an SOC calculating means 121, a chargeable-limit calculating means 122, and a charge-control-range calculating means 123. The SOC calculating means 121 calculates the charge rate (SOC) of the battery 10 based on a current measurement value measured by the current sensor 112. The chargeable-limit calculating means 122 uses the chargeable-limit detecting method of the present embodiment to calculate SOC of the point when conditions of the chargeable limit of the battery 10 are satisfied. Furthermore, the charge-control-range calculating means 123 calculates a charge control range with respect to the battery 10 based on SOC of the chargeable limit calculated by the chargeable-limit calculating means 122.

In the chargeable-limit detecting method of the present embodiment, below conditions are provided as the conditions of the chargeable limit.

(1) The temperature of the battery 10 is higher than a predetermined temperature threshold (2) The voltage of the battery 10 is higher than a predetermined voltage threshold (3) An average current of the battery 10 is within a predetermined current threshold range (4) A voltage excess rate is larger than a predetermined voltage excess rate threshold (5) The condition satisfied duration of above described (1) to (4) is longer than a predetermined duration threshold The above described thresholds are stored in the storage unit 130 in advance, and these can be read and used in determination of condition satisfaction.

When an activated state upon activation is changed to a running state in which operation is continuously carried out at a predetermined cycle, the chargeable-limit detecting device 100 measures the voltage, current, and temperature of the battery 10 by using the state detecting sensor unit 110 at cycle operation time-points. In accordance with the chargeable-limit detecting method of the present embodiment, the arithmetic processing unit 120 uses the above described measurement values at the cycle operation time-points to calculate SOC of the point when the chargeable limit of the battery 10 is satisfied.

The flow of the process according to the chargeable-limit detecting method of the present embodiment will be explained below by using FIG. 1. When the chargeable-limit detecting device 100 is in the running state, the process explained below is periodically executed by the arithmetic processing unit 120 at the cycle operation time-point of a predetermined cycle td (for example, 10 ms). First, in step S1, a temperature measurement value Tm, a voltage measurement value Vm, and a current measurement value Im of the battery 10 are acquired by the sensors of the state detecting sensor unit 110.

In step S2, SOC of the battery 10 is updated to a latest value by using the SOC calculating means 121. In the case in which a charging current is determined if the current measurement value Im is positive and a discharging current is determined if the current measurement value Im is negative, the update of SOC can be carried out by, for example, adding the capacity of the case, in which a current Im is charged/discharged during a cycle td, to SOC calculated at the previous cycle operation time-point.

In step S3, whether the temperature measurement value Tm is higher than the temperature threshold Tt or not is determined. If the temperature measurement value Tm is in a low-temperature state of equal to or less than the temperature threshold Tt, the battery 10 cannot be charged almost at all. Therefore, if the temperature measurement value Tm is equal to or less than the temperature threshold Tt, it is determined that the condition for determining the chargeable limit is not satisfied, and the process proceeds to step S14. On the other hand, if the temperature measurement value Tm is higher than the temperature threshold Tt, the process proceeds to step S4 in order to determine other conditions of the chargeable limit. The temperature threshold Tt can be, for example, 0° C.

In step S4, it is determined that whether the voltage measurement value Vm is higher than the voltage threshold Vt or not. The inventor found out that the voltage measurement value Vm had a value close to or higher than 14 V when the charge rate SOC of the battery 10 was in a state close to the chargeable limit. Therefore, a value close to 14 V is set as the voltage threshold Vt. If the voltage measurement value Vm is equal to or less than that, the process of step S9 is carried out. On the other hand, if the voltage measurement value Vm is higher than the voltage threshold Vt, the process proceeds to next step S5 in order to determine other conditions of the chargeable limit. The voltage threshold Vt can be, for example, 13.5 V.

In step S5, in order to select a calculating method of the average current Ia of the battery 10, it is determined whether the average current (referred to as Ia') calculated at the previous cycle operation time-point is larger than the predetermined current threshold It or not. The average current Ia is an average value obtained by averaging the current measurement value Im acquired in step S1 with the current measurement values acquired respectively at the cycle operation time-points before that by a predetermined method.

In the calculation of the average current Ia immediately after the chargeable-limit detecting device 100 has become the running state, the average current Ia' calculated at a cycle operation time-point therebefore is not present; therefore, a different calculating method has to be used. Therefore, in order to enable determination that whether it is the calculation of the average current Ia immediately after it has become the running state or not, a predetermined initial value is set as the average current Ia in the activated state before it has become the running state. The initial value has a sufficient large value (a value having larger digits) compared with the current measurement value Im.

Also, as the current threshold It, a value which is sufficiently larger than the current measurement value Im and is smaller than the initial value of the average current Ia (a value smaller than and close to the initial value of the average current Ia) is set.

As a result of setting the initial value of the average current Ia and the current threshold It in the above described manner, in the process immediately after it has become the running state, the condition of step S5 is satisfied, and the calculation of the average current Ia in step S6 is carried out. Also, if the condition of step S3 or step S4 is not satisfied at the first cycle operation time-point immediately after it has become the running state, and even if the conditions of step S3 and step S4 are satisfied for the first time at the second cycle operation time-point and thereafter to proceed to step S5, the condition of step S5 is satisfied to carry out the calculation of the average current Ia in step S6. On the other hand, if the condition of step S5 is not satisfied, the process then proceeds to step S7, wherein the calculation of the average current Ia is carried out by a different calculating equation.

In step S6, the average current Ia is calculated by a below equation.

$$Ia = Im \qquad (1)$$

In step S7, the average current Ia is calculated by a below equation.

$$Ia = Ia' = (1-W) + Im \times W \qquad (2)$$

Herein, W represents a weight coefficient ($0<W<1$). Ia' of the right side of the equation (2) represents the average current calculated at the previous cycle operation time-point. The equation (1) is used if the previous average current is larger than the current threshold It. If the previous average current is equal to or less than the current threshold It, the calculation of the average current Ia is carried out by using the equation (2).

In the calculating method of the average current Ia using the equation (2), the current measurement value Im acquired therebefore is not required to be saved to calculate the average current Ia, and only the average current Ia' calculated at the previous cycle operation time-point is required to be saved in the storage unit 130. In the equation (2), a preferred average current Ia is obtained by appropriately setting the weight coefficient W. A required memory capacity is significantly reduced by calculating the average current Ia by using the equation (2).

When the average current Ia is calculated in step S6 or step S7, the process then proceeds to step S8, wherein a voltage-excess determination value JV is set to 1 to correspond to the fact that the voltage measurement value Vm has been determined to be higher than the voltage threshold Vt in step S4. On the other hand, if the voltage measurement value Vm is determined to be equal to or lower than the voltage threshold Vt in step S4, the voltage-excess determination value JV is set to 0 in step S9. The voltage-excess determination value JV is 1-bit data having a value of 0 or 1. When the voltage-excess determination value JV is set to 1 or 0 in step S8 or step S9, the process then proceeds to step S10.

Figure 5:
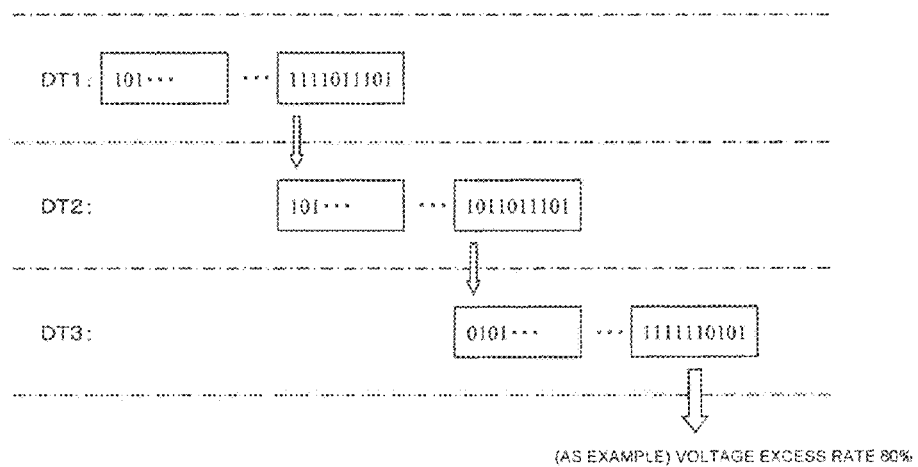
FIG. 5 is an explanatory drawing showing an example of a memory structure of data used in calculation of a voltage excess rate.

In step S10, the voltage excess rate RV is calculated by using the voltage-excess determination value JV set in step S8 or step S9. A method of calculating the voltage excess rate will be explained by using FIG. 5. FIG. 5 shows an example of a memory structure in which the data required for calculating the voltage excess rate RV from the value of the voltage-excess determination value JV is configured to be stored in the storage unit 130 with a small capacity. Herein, in order to store the data for calculating the voltage excess rate, three units of data (first to third n-bit data DT1 to DT3) each having n (natural number) bits are used. The value of n can be, for example, 10.

The first n-bit data DT1 is used for saving the value of the voltage-excess determination value JV. After the data of the n-bit data DT1 is shifted to the right by 1 bit, the value of a latest voltage-excess determination value JV is set at the bit at the head (left end). Then, when the values of the voltage-excess determination values JV corresponding to n-bits (corresponding to n-cycles) are set, whether the number of the bits having the value "1" among the n-bits is equal to or more than a predetermined number is determined. As a result, if the number of the bits having the value 1 is equal to or more than the predetermined number, the data of the second n-bit data DT2 is shifted to the right by 1 bit, and a determination value 1 is then set at the head bit. On the other hand, if the number of the bits having the value 1 is less than the predetermined number, the data is similarly shifted to the right, and a determination value 0 is then set at the head bit. Then, the values of all the bits of the first n-bit data DT1 are cleared to 0. The above described predetermined number is, for example, 8 if n is 10.

In the above described manner, the determination value of 1 or 0 is set in the second n-bit data DT2; and, when the determination values corresponding to n-bits (corresponding to n×n cycles) are set, whether the number of the bits having the value 1 is equal to or more than a predetermined number among the n-bits is determined next with respect to the second n-bit data DT2. As a result, if the number of the bits having the value 1 is equal to or more than the predetermined number, the data of the third n-bit data DT3 is shifted to the right by 1 bit, and a determination value 1 is then set at the head bit thereof. On the other hand, if the number of the bits having the value 1 is less than the predetermined number, a determination value 0 is set at the head bit after the data is similarly shifted to the right. Then, the values of all the bits of the second n-bit data DT2 are cleared to 0. Note that, also in this case, the above described predetermined number can be, for example, 8 when n is 10.

The third n-bit data DT3 set in the above described manner is used in calculation of the voltage excess rate RV. All the first to third n-bit data DT1 to DT3 is cleared to 0 before the chargeable-limit detecting device 100 undergoes transition to the running state. Until the determination value 1 or 0 is set in all of the n bits of the third n-bit data DT3, the value of the voltage excess rate RV is 0. If the determination value is set in all of the n-bits of the third n-bit data DT3 (corresponding to n×n×n cycle), the value of the voltage excess rate RV is calculated. The voltage excess rate RV is calculated as the rate of the number of bits having the value 1 among the n-bits of the third n-bit data DT3. For example, if there are eight bits having the value 1 in the case in which n is 10, the value of the voltage excess rate RV is 80%.

After the determination values are set in all the n-bits of the third n-bit data DT3, the data of the bit at the end (right end) is discarded when the data is shifted to the right by 1 bit.

When the three units of n-bit data DT1 to DT3 are used in the above described manner, the voltage excess rate RV can be calculated by using the information of the voltage-excess determination values JV corresponding to the n×n×n cycles. Only a memory corresponding to 3n bits is required to save the information of the voltage-excess determination values JV corresponding to the n×n×n cycles in the storage unit 130, and the required memory capacity can be significantly reduced.

Figure 6:
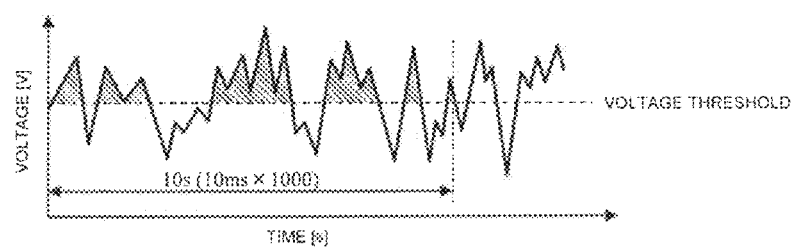
FIG. 6 is a graph schematically showing an example of voltage variations when a cycle is 10 ms.

An example of voltage variation in the case in which n is 10 and the cycle td is 10 ms is schematically shown in FIG. 6. In this case, the voltage excess rate (rate of the hatched part shown in FIG. 6) can be calculated from the voltage measurement values Vm during 10 s (10 ms×10×10×10) by using a memory of 30 bits. In this case, the three units of n-bit data DT1 to DT3 are used; however, the data is not limited thereto, and the number of units of the n-bit data can be increased or decreased. Moreover, when the bit number n is decreased or increased along with that, the information amount of the voltage-excess determination value JV equivalent to that of the above described embodiment can be saved in the storage unit 130.

When the voltage excess rate RV is calculated in step S10, whether the voltage excess rate RV is larger than a voltage-excess-rate threshold Rt or not is determined in step S11. As a result, if the voltage excess rate RV is determined to be larger than a voltage-excess-rate threshold Rt, the process proceeds to next step S12; on the other hand, if the voltage excess rate RV is determined to be equal to or less than the voltage-excess-rate threshold Rt, the process proceeds to step S14.

In step S12, whether the average current Ia satisfies a predetermined current threshold range or not is determined. In this case, whether the average current Ia has a value close to 0 or not is determined; wherein, specifically, the determination is carried out by using a negative threshold It1 and a positive threshold It2. More specifically, if the average current Ia is within a current threshold range larger than It1 and smaller than It2, it is determined that the condition of the chargeable limit is satisfied, and the process proceeds to step S13; in the case other than that, it is determined that the condition of the chargeable limit is not satisfied, and the process proceeds to step S14.

In step S13, elapsed time from when the conditions of the chargeable limit are satisfied, in other words, the condition satisfied duration tc is updated by tc=tc'+td. Herein, tc' of the right side is the condition satisfied duration updated at the previous cycle operation time-point. Meanwhile, if the process proceeds to step S14, the condition satisfied duration tc is cleared to 0. The condition satisfied duration tc is also cleared to 0 before the chargeable-limit detecting device 100 undergoes transition to the running state. After the condition satisfied duration tc is updated in step S13, the process proceeds to step S15. After the condition satisfied duration tc is cleared to 0 in step S14, the process proceeds to step S17.

In step S15, whether the condition satisfied duration tc is longer than a predetermined duration threshold tt or not is determined. If the condition satisfied duration tc is determined to be longer than the predetermined duration threshold tt, the process proceeds to step S16; if not, the process proceeds to step S17. In step S16, since all the conditions of the chargeable limit are satisfied, SOC updated in step S2 is set as SOC of the chargeable limit, and the process then proceeds to step S19.

On the other hand, if the process proceeds to step S17 since it is determined that any of the conditions of the chargeable limit is not satisfied, the latest SOC updated in step S2 and SOC of the chargeable limit set therebefore are compared with each other. If the latest SOC is determined to be larger than SOC of the chargeable limit, the process proceeds to step S18; if not, the process proceeds to step S19. In step S18, the latest SOC updated in step S2 is set as SOC of the chargeable limit, and the process then proceeds to step S19.

In the above described process of steps S17 and S18, if SOC is increased than before when the cyclic update of SOC of the chargeable limit by the chargeable-limit detecting device 100 is once stopped and started again thereafter, SOC of the chargeable limit is configured to be updated unconditionally. In other words, if the latest SOC updated in step S2 is larger than the chargeable-limit charge rate calculated in the previous time, SOC of the chargeable limit is updated by the latest SOC regardless of the satisfaction of the conditions of the chargeable limit. As a result, when SOC is increased, the charge rate of the chargeable limit can be immediately updated.

In step S19, the charge control range of the battery 10 is calculated by using SOC of the chargeable limit set in step S16 or S18 or SOC of the chargeable limit set until the previous cycle operation time-point. The charge control range can be set so that the upper limit of the control range is SOC of the chargeable limit and that the result obtained by subtracting a predetermined charge rate therefrom is set as the lower limit thereof. Moreover, a chargeable capacity and a dischargeable capacity can be calculated from the set charge control range and SOC updated in step S2.

Figure 7:
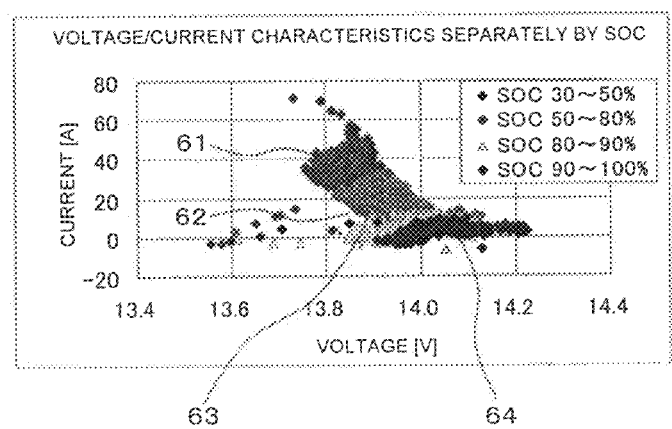
FIG. 7 is a graph showing variations of voltage measurement values with respect to current measurement values when SOC serves as a parameter.
Figure 8:
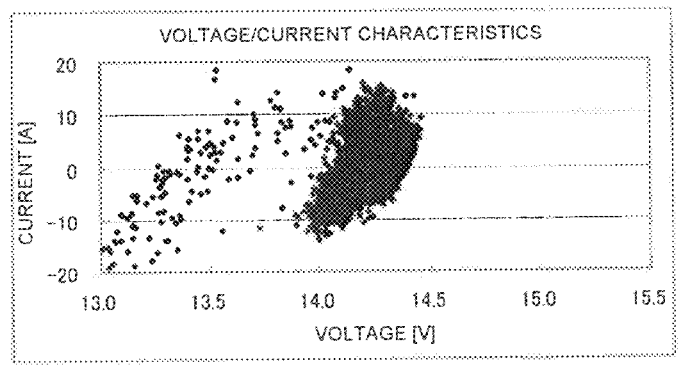
FIG. 8 is a graph showing variations of voltage measurement values with respect to current measurement values when SOC is about 95%.

In the flow of the process of the chargeable-limit detecting method of the present embodiment shown in FIG. 1, as the conditions satisfied for the chargeable limit, the condition with respect to the voltage measurement value Vm is determined in step S4, and the condition with respect to the average current is determined in step S12. This is based on the fact that the voltage and the current of the battery 10 show variations as shown in FIGS. 7 and 8 depending on SOC. FIG. 7 shows variations of the voltage measurement value with respect to the current measurement value when SOC serves as a parameter. The variations of the voltage measurement value with respect to the current measurement value when SOC is 30 to 50%, 50 to 80%, 80 to 90%, and 90 to 100% are shown by reference numerals 61, 62, 63, and 64, respectively. FIG. 8 shows variations of the voltage measurement value with respect to the current measurement value when SOC is about 95%.

As shown in FIGS. 7 and 8, it can be understood that, when SOC of the battery 10 becomes close to the chargeable limit (SOC is 90 to 100%), the voltage becomes close to 14 V or higher, and the absolute value of the current becomes approximately 10 A or less. Therefore, the voltage threshold Vt is preferred to be set to, for example, 13.5 V.

Figure 9:
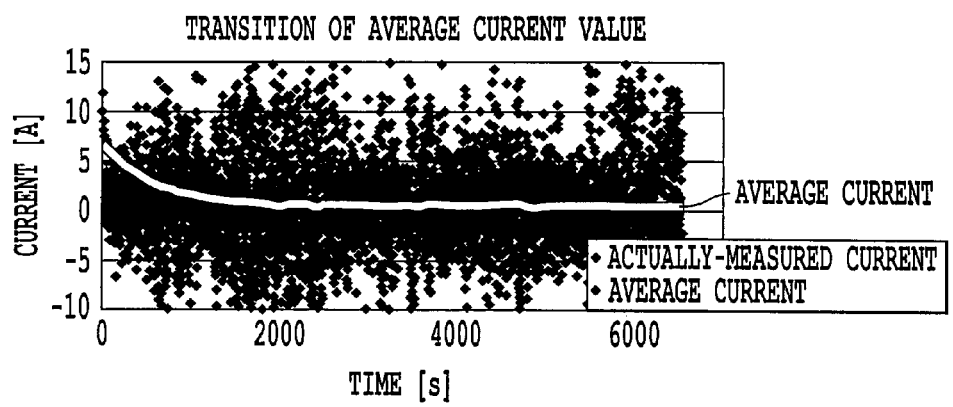
FIG. 9 is a graph showing variations of the current measurement value and an average current Ia (weight coefficient W=0.002) in a state close to the chargeable limit.
Figure 10:
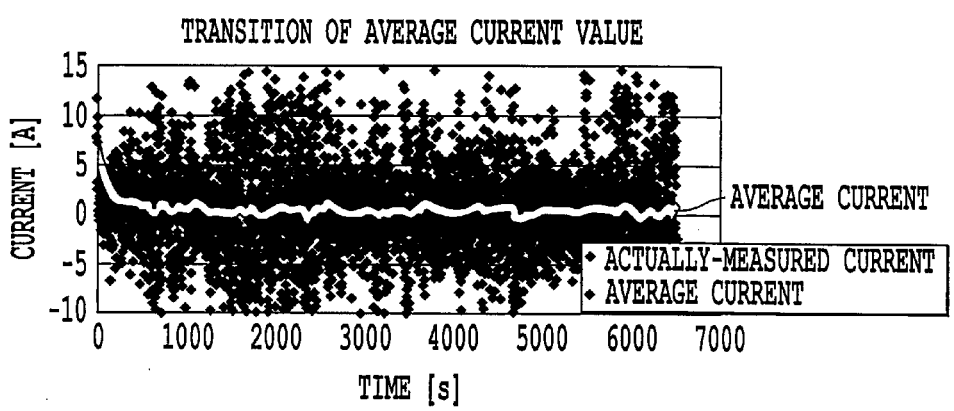
FIG. 10 is a graph showing variations of the current measurement value and the average current Ia (weight coefficient W=0.01) in a state close to the chargeable limit.
Figure 11:
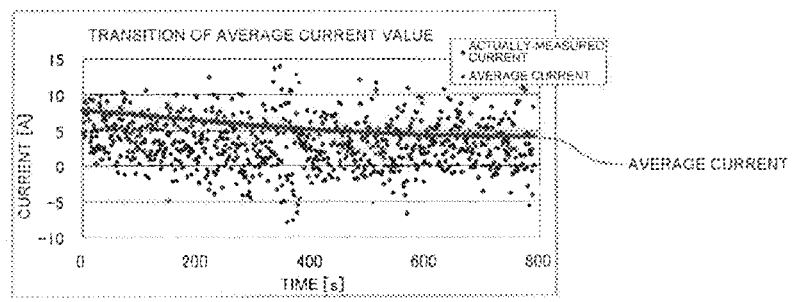
FIG. 11 is a graph showing variations of the current measurement value and the average current Ia (weight coefficient W=0.002) in a state in which the battery 10 can be charged.

The average current Ia calculated in step S7 and the weight coefficient W used in the calculation will be explained below by using examples shown in FIGS. 9, 10, and 11. FIG. 9 shows the current measurement values Im measured in the state in which the battery 10 is close to the chargeable limit and variations of the average current Ia calculated therefrom by the equation (2) using the weight coefficient W=0.002. Similarly, FIG. 10 shows variations of the average current Ia using the weight coefficient W=0.01. FIG. 11 shows the current measurement values Im measured in the state in which the battery 10 is in a chargeable state and variations of the average current Ia calculated therefrom by the equation (2) using the weight coefficient W=0.002.

According to FIGS. 9 and 10, it can be understood that, when the battery 10 is in the state close to the chargeable limit, the average current exhibits a value close to 0 A. Moreover, according to FIG. 11, it can be understood that, when the battery 10 is in a chargeable state, the average current is increased compared with the state close to the chargeable limit. Therefore, the current threshold range It1 to It2 is preferred to be, for example, −1A to 1A. On the other hand, it can be understood that, in the case of the weight coefficient W=0.01 shown in FIG. 10, the average current Ia is not stabilized. Therefore, the weight coefficient W is preferred to be about 0.002.

Figure 12:
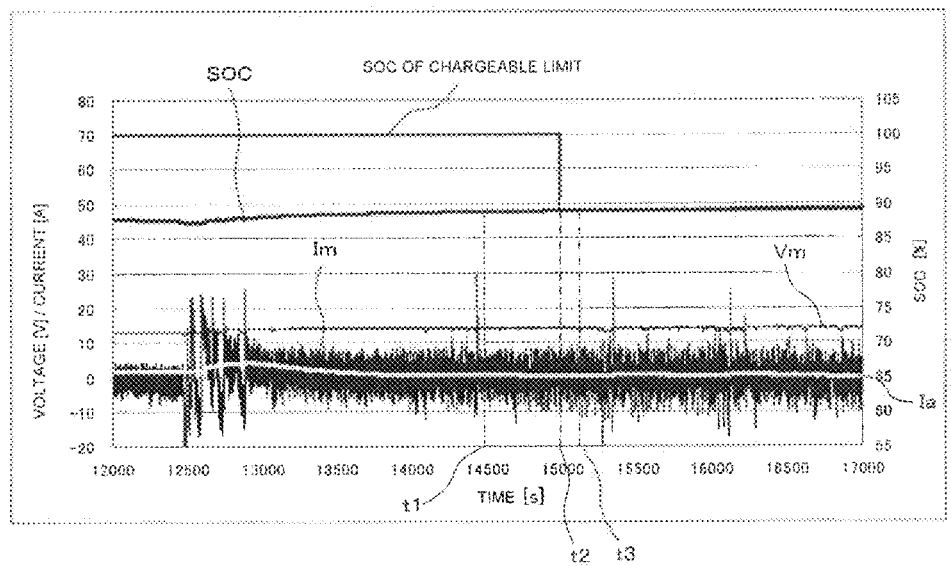
FIG. 12 is a graph showing over-time variations of the voltage measurement value, current measurement value, SOC, average current, and SOC of the chargeable limit.

An example of calculating SOC of the chargeable limit by using the chargeable-limit detecting method and the chargeable-limit detecting device of the battery 10 of the present embodiment will be explained below by using FIG. 12. FIG. 12 is a graph showing over-time variations of the voltage measurement value Vm, the current measurement value Im, SOC, the average current Ia, and SOC of the chargeable limit of the battery 10.

FIG. 12 shows an example in which the conditions of the chargeable limit are satisfied at the point of time t=t1 on the horizontal axis, wherein this continues until time t3 through the point of time t2. The duration from the time t1 to the time t2 is equal to the duration threshold tt, and SOC of the chargeable limit is updated from the point of the time t2 to the point of the time t3. At each of the points of the time t2 to t3, SOC of the chargeable limit is changed to SOC of the point.

As shown in the above described embodiment, according to the chargeable-limit detecting method of the present invention and the device of the same, the charge rate at the time point of the chargeable limit to which the secondary battery can be charged can be detected; therefore, even in a secondary battery having a deteriorated state, the charge control range can be suitably adjusted depending on the state at the point. Moreover, the current chargeable capacity or dischargeable capacity of the secondary battery can be also calculated from the charge control range. Furthermore, the memory capacity required for calculating the charge rate of the chargeable limit can be significantly reduced, and the chargeable-limit detecting device of the present invention can be provided at low cost.

The description of the present embodiment shows an example of the secondary-battery chargeable-limit detecting method according to the present invention and the device of the same, but is not limited thereto. The detailed configuration, detailed operations, etc. of the secondary-battery chargeable-limit detecting method and the device of the same in the present embodiment can be arbitrarily changed within a range not departing from the gist of the present invention.

REFERENCE NUMERALS

1: Power supply system
10: Battery
20: Power generator
30: Load
100: Chargeable-limit detecting device
110: State detecting sensor unit
111: Voltage sensor
112: Current sensor
113: Temperature sensor
120: Arithmetic processing unit
121: SOC calculating means
122: Chargeable-limit calculating means
123: Charge-control-range calculating means
130: Storage unit

The invention claimed is:

1. A secondary-battery chargeable-limit detecting method of detecting a charge rate of a chargeable limit serving as an upper limit of a chargeable charge rate of a secondary battery at every cycle operation time-point of a predetermined cycle, comprising:
when reaching the cycle operation time-point,
measuring a voltage, a current, and a temperature of the secondary battery;
calculating the charge rate of the secondary battery is calculated based on the current measurement value;
calculating an average current corresponding to an average value of the current measurement value in a predetermined period;
calculating a voltage excess rate representing a rate that the voltage measurement value becomes higher than a predetermined voltage threshold in a predetermined period;
when all of conditions that: the temperature measurement value is higher than a predetermined temperature threshold, the voltage measurement value is higher than the voltage threshold, the average current is within a predetermined current threshold range including 0, and the voltage excess rate is larger than a predetermined voltage-excess-rate threshold are determined to be satisfied, calculating a condition satisfied duration in which the conditions are continuously satisfied; and
when the condition satisfied duration is determined to be longer than a predetermined duration threshold, setting the charge rate as the charge rate of the chargeable limit.

2. The secondary-battery chargeable-limit detecting method according to claim 1, wherein,
when a predetermined weight coefficient is W (0<W<1), the average current Ia is calculated from the average current Ia' calculated at a previous cycle operation time-point and the current measurement value Im by a below equation Ia=Ia'×(1−W)+Im×W.

3. The secondary-battery chargeable-limit detecting method according to claim 1 or 2, wherein
a voltage-excess determination value that is 1-bit data and m, which is a natural number of 2 or more, units of n-bit data composed of n, which is a natural number of 2 or more, bits are used to set the value of the voltage-excess determination value to 1 when the voltage measurement value is higher than the voltage threshold and to 0 when the voltage measurement value is not higher than the voltage threshold;

a first n-bit data is shifted to the right by 1 bit to set the value of the voltage-excess determination value at a head bit at a left end;

when the value of the voltage-excess determination value is set at all the bits of the first n-bit data, a second n-bit data is shifted to the right by 1 bit, 1 is set at a head bit of the second n-bit data when the number of the bits having the value of 1 in the first n-bit data is equal to or more than a predetermined number, 0 is set when the number of the bits having the value of 1 in the first n-bit data is not equal to or more than the predetermined number, and values of all the bits of the first n-bit data are cleared to 0; and when values are set thereafter at all the bits of the m-th n-bit data in a similar manner, a rate of the number of the bits having a value of 1 in the m-th n-bit data is set to the voltage excess rate.

4. The secondary-battery chargeable-limit detecting method according to claim 1, wherein
when the charge rate is determined to be larger than the charge rate of the chargeable limit set therebefore, the charge rate is set as the charge rate of the chargeable limit.

5. A secondary-battery chargeable-limit detecting device of detecting a charge rate of a chargeable limit serving as an upper limit of a chargeable charge rate of a secondary battery at every cycle operation time-point of a predetermined cycle, the device comprising:
a state detecting sensor unit including a voltage sensor that measures a voltage of the secondary battery, a current sensor that measures a current, and a temperature sensor that measures a temperature;
a storage unit; and
an arithmetic processing unit including
a charge-rate calculating means that calculates a charge rate at the cycle operation time-point from a current measurement value measured by the current sensor and a previous charge rate calculated at a previous cycle operation time-point saved in the storage unit, and
a chargeable-limit calculating means that determines a predetermined chargeable-limit condition and, when the condition is satisfied, outputs the charge rate of the chargeable limit, wherein
the chargeable-limit calculating means:
calculates a voltage excess rate representing a rate that the voltage measurement value is higher than a predetermined voltage threshold in a predetermined period,
when all of conditions that: the temperature measurement value is higher than a predetermined temperature threshold, the voltage measurement value is higher than the voltage threshold, the average current is within a predetermined current threshold range including 0, and the voltage excess rate is larger than a predetermined voltage-excess-rate threshold are determined to be satisfied as the chargeable limit conditions, calculates a condition satisfied duration in which the conditions are continuously satisfied, and when the condition satisfied duration is determined to be longer than a predetermined duration threshold, sets the charge rate as the charge rate of the chargeable limit.

6. The secondary-battery chargeable-limit detecting device according to claim 5, wherein the arithmetic processing unit further has a charge-control-range calculating means that calculates a charge control range with respect to the secondary battery based on the charge rate of the chargeable limit calculated by the chargeable-limit calculating means.

7. The secondary-battery chargeable-limit detecting method according to claim 2, wherein
when the charge rate is determined to be larger than the charge rate of the chargeable limit set therebefore, the charge rate is set as the charge rate of the chargeable limit.

8. The secondary-battery chargeable-limit detecting method according to claim 3, wherein
when the charge rate is determined to be larger than the charge rate of the chargeable limit set therebefore, the charge rate is set as the charge rate of the chargeable limit.

9. A secondary-battery chargeable-limit detecting device of detecting a charge rate of a chargeable limit serving as an upper limit of a chargeable charge rate of a secondary battery at every cycle operation time-point of a predetermined cycle, the device comprising:
state detecting sensors including a voltage sensor that measures a voltage of the secondary battery, a current sensor that measures a current, and a temperature sensor that measures a temperature;
a storage medium; and
circuitry configured to:
calculate a charge rate at the cycle operation time-point from a current measurement value measured by the current sensor and a previous charge rate calculated at a previous cycle operation time-point saved in the storage medium, and
determine a predetermined chargeable-limit condition and, when the condition is satisfied, output the charge rate of the chargeable limit, wherein
the circuitry is further configured to:
calculate a voltage excess rate representing a rate that the voltage measurement value is higher than a predetermined voltage threshold in a predetermined period,
when all of conditions that: the temperature measurement value is higher than a predetermined temperature threshold, the voltage measurement value is higher than the voltage threshold, the average current is within a predetermined current threshold range including 0, and the voltage excess rate is larger than a predetermined voltage-excess-rate threshold are determined to be satisfied as the chargeable limit conditions, calculate a condition satisfied duration in which the conditions are continuously satisfied, and
when the condition satisfied duration is determined to be longer than a predetermined duration threshold, set the charge rate as the charge rate of the chargeable limit.

10. The secondary-battery chargeable-limit detecting device according to claim 9, wherein the circuitry is further configured to calculate a charge control range with respect to the secondary battery based on the charge rate of the chargeable limit calculated.

* * * * *